United States Patent
Kang et al.

(10) Patent No.: US 7,215,170 B1
(45) Date of Patent: May 8, 2007

(54) LOW VOLTAGE LOGIC CIRCUIT WITH SET AND/OR RESET FUNCTIONALITY

(75) Inventors: Pozeng Kang, San Jose, CA (US); Gabriel Ming-Yu Li, San Francisco, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 15 days.

(21) Appl. No.: 10/941,753

(22) Filed: Sep. 15, 2004
(Under 37 CFR 1.47)

Related U.S. Application Data

(60) Provisional application No. 60/503,225, filed on Sep. 16, 2003.

(51) Int. Cl.
*H03K 3/00* (2006.01)

(52) U.S. Cl. .................. 327/218; 327/199; 327/202; 327/207

(58) Field of Classification Search ............. 327/199, 327/200, 201, 202, 211, 212, 214, 215, 217, 327/218
See application file for complete search history.

(56) References Cited

U.S. PATENT DOCUMENTS

| | | | | |
|---|---|---|---|---|
| 3,984,702 A | * | 10/1976 | Fett | 377/80 |
| 4,528,465 A | * | 7/1985 | Harvey | 326/127 |
| 4,970,417 A | * | 11/1990 | Kubota | 326/80 |
| 5,122,682 A | | 6/1992 | Nagasawa | 326/115 |
| 5,191,233 A | | 3/1993 | Nakano | 327/333 |
| 5,220,212 A | * | 6/1993 | Sinh | 326/126 |
| 5,289,055 A | | 2/1994 | Razavi | 326/126 |
| 5,359,241 A | | 10/1994 | Hasegawa et al. | 326/126 |
| 5,815,019 A | | 9/1998 | Uemura et al. | 327/202 |
| 5,844,437 A | * | 12/1998 | Asazawa et al. | 327/202 |
| 5,850,155 A | * | 12/1998 | Matsumoto | 326/109 |
| 5,880,616 A | | 3/1999 | Park et al. | 327/333 |
| 5,900,760 A | | 5/1999 | Lee | 327/202 |
| 6,501,315 B1 | | 12/2002 | Nguyen | 327/217 |
| 6,538,481 B1 | | 3/2003 | Suetsugu | 327/109 |

OTHER PUBLICATIONS

Razavi et al., "Design Techniques for Low-Voltage High-Speed Digital Bipolar Circuits," IEEE Journal of Solid-State Circuits, vol. 29, No. 3, Mar. 1994, pp. 332-339.

* cited by examiner

*Primary Examiner*—Quan Tra
*Assistant Examiner*—Khareem E Almo
(74) *Attorney, Agent, or Firm*—Kevin L. Daffer; Daffer McDaniel, LLP

(57) ABSTRACT

A low voltage logic circuit with asynchronous SET and/or RESET functions is described herein. The low voltage logic circuit may be primarily used in forming low voltage flip-flop circuits, but may also be used to form multiplexers and other logic configurations. The flip-flop circuit described herein improves upon existing low voltage architectures by providing a flip-flop circuit, which can operate at relatively low supply voltages (e.g., less than about 1.8V), with SET and/or RESET capability. In doing so, the improved flip-flop circuit may be used within a phase frequency detector, programmable counter, or frequency divider of a phase locked loop (PLL) or delay locked loop (DLL) device. However, the improved flip-flop circuit may be used with any low voltage circuit or device that may require, use or benefit from a SET or RESET function. In some embodiments, one or more level shift circuits may be included so that the low voltage flip-flop circuit may receive CML, TTL and/or CMOS logic levels (among others).

17 Claims, 9 Drawing Sheets

LOW VOLTAGE LOGIC CIRCUIT WITH SET AND/OR RESET FUNCTIONALITY

PRIORITY CLAIM

This application claims benefit of priority to Provisional Patent Application Ser. No. 60/503,225, entitled "Low Voltage CML Flip Flop for Phase Frequency Detector," filed Sep. 16, 2003, which is hereby incorporated in its entirety.

BACKGROUND OF THE INVENTION

1. Field of the Invention

This invention relates to electronic circuits and, more particularly, to flip-flop and other logic circuits, which are operable at low power supply voltages (e.g., less than about 1.8 volts) and have SET and/or RESET functionality.

2. Description of the Related Art

The following descriptions and examples are not admitted to be prior art by virtue of their inclusion within this section.

Many electronic systems now use supply voltages that fall significantly below the conventional 5.0 volt standard. The demand for reduced power dissipation and battery requirements (e.g., in applications such as wireless and personal computing) has motivated designers to scale the supply voltage of digital circuits down from the 5.0 volt standard to about 3.3 volts, 2.5 volts, and in some cases, 1.8 volts or lower. This trend is augmented by the fact that faster silicon devices generally have lower breakdown voltages, which in turn, require lower supply voltages if device dimensions are to be scaled down. However, it is often difficult to preserve high-speed operation at low supply voltages, especially as voltages fall below approximately 1.8 volts.

Emitter-Coupled Logic (ECL) technology is often used for implementing high-speed logic circuits. ECL circuits generally differ from Metal-Oxide Semiconductor (MOS) circuits by using Bipolar Junction Transistors (BJTs) instead of Field Effect Transistors (FETs). Another difference lies in the manner in which the transistors are operated. For example, MOSFET transistors are usually operated in saturation, and therefore, demonstrate a relatively large voltage swing between transistor "on" and "off" states. To increase operating speeds, the bipolar transistors of an ECL circuit are typically configured for operating in the linear region preceding the saturation region. For example, a relatively constant current can be maintained at the emitter terminal of a bipolar transistor, so that the transistor may operate in a "current mode." The current mode of operation provides relatively fast switching speeds by eliminating saturation mode operation and reducing the voltage swing between transistor "on" and "off" states. Logic circuits that operate in the current mode may be alternatively known as Current Mode Logic (CML).

A flip-flop is one example of a circuit that may be implemented with ECL (or CML) logic gates. In some cases, a flip-flop circuit may be implemented with a pair of cross-coupled NAND or NOR logic gates. Each of the cross-coupled logic gates may include a plurality of transistors, two or more of which may be arranged in a stacked configuration. In operation, the flip-flop circuit may receive a pair of inputs for generating a pair of complementary outputs, normally labeled "Q" and "Qbar." When the flip-flop changes states, both Q and Qbar will correspondingly change states. When one output changes to a logic high (e.g., a logic "1") state, the other output will change to a logic low (e.g., a logic "0") state, and vice versa. In some cases, a clocking signal may be supplied to the flip-flop, so that all logic state changes are synchronized to occur on a rising or falling transition of a clock pulse.

If the pair of inputs supplied to the cross-coupled logic gates are labeled "SET" and "RESET," the flip-flop may be referred to as a SET/RESET (or SR-type) flip-flop. In some cases, an SR-type flip-flop may be "set" when Q=1 and Qbar=0, and "reset" when Q=0 and Qbar=1. As such, an SR-type flip-flop may change states upon sensing a change in state at the S or R inputs (asynchronous to the clock pulse input to the flip-flop), and may store the results of the change until the opposite input is clocked out by the rising/falling transition of the clock source. The process of changing the flip-flop to the Q=1, Qbar=0 state may be referred to as "setting" the flip-flop, whereas the process of changing the flip-flop to the Q=0, Qbar=1 state may be referred to as "resetting" the flip-flop. The opposite may be true in other cases. Due to it's asynchronous SET/RESET capability, this type of SR flip-flop is often used within one or more components of a phase locked loop (PLL) device, such as a phase frequency detector (PFD), frequency divider or programmable counter. An asynchronous SR flip-flop may also be used in other, more general logic designs.

Another type of flip-flop with SET and RESET functionality is commonly referred to as a Delay (or D-type) flip-flop. The D-type flip-flop may also be referred to as a Data flip-flop. In some cases, the D-type flip-flop may be implemented by placing an inverter at the R input of an SR-type flip-flop. Since the S and R inputs of a D-type flip-flop are always in opposite states, the Q output of the D-type flip-flop will track the state of the data present at the D input. D-type flip-flops are often used to form registers. For example, several D-type flip-flops may be connected in series to form shift registers, or in parallel to form data storage registers. D-type flip-flops may also be used within one or more components of a phase-locked loop (PLL) device. For example, one or more D-type flip-flops may be included within a phase frequency detector, frequency divider or programmable counter. Like the SR flip-flop, the D-type flip-flop can also be used in general logic designs.

FIG. 1 illustrates one example of a conventional D-type flip-flop circuit 100. Flip-flop circuit 100 generally includes master portion 110 and slave portion 120. In FIG. 1, master portion 110 and slave portion 120 each include a plurality of bipolar junction transistors (BJTs), and more specifically, six NPN transistors arranged between a power supply node (VPWR) and a ground node (GND). Within master portion 110, differential transistors N1 and N2 are configured for receiving a pair of differential input signals ("D" and "Dbar") and generating a pair of complementary values ("Z" and "Zbar"). The pair of complementary values are latched by differential transistors N3 and N4 during a clock transition, e.g., from low to high. Slave portion 120, which is configured similar to master portion 110, is coupled in series with the master portion for receiving the pair of complementary values ("Z" and "Zbar") latched from the master portion. The output signals, Q and Qbar, from slave portion 120 are set by differential transistors N7 and N8. During the next clock transition, e.g., from high to low, the D and Dbar signals input to master portion 110 are enabled and the Q and Qbar outputs are latched by differential transistors N9 and N10.

A principle difficulty in scaling the supply voltage of digital bipolar circuits (e.g., those using ECL/CML technology) is that the "turn on" potential, e.g., the base-emitter voltage ($V_{BE}$) of NPN transistors, does not scale linearly with technology. In other words, the base-emitter voltage may be expressed as:

$$V_{BE} \approx V_T \ln(I_C/I_S) \qquad \text{EQ. 1}$$

where $V_T = kT/q$, $I_C$ is the collector current, and $I_S$ is the reverse saturation current. In practice, the current density $(I_C/I_S)$ of bipolar transistors has either remained constant or increased, leading to a similar trend for the base-emitter voltage $(V_{BE})$. In current technology, the $V_{BE}$ of a typical NPN transistor may be approximately equal to 0.9 volts.

In order to accommodate low supply voltages (e.g., less than about 1.8 volts), any current path extending between the power supply and ground nodes within a bipolar circuit must include no more than one base-emitter junction. In other words, each current path between power and ground must include no "stacked" input transistors. As used herein, two input transistors are said to be "stacked" if the emitter terminal of one transistor is connected to the collector terminal of another transistor. Because the base-emitter junctions of the stacked transistors each produce a voltage drop of approximately 0.9 volts, a substantially larger supply voltage (e.g., substantially greater than 1.8 volts) must be supplied to the flip-flop circuit to avoid driving the stacked transistors into deep saturation. As noted above, ECL circuits usually avoid operating in the saturation region to avoid the reduced operating speed that occurs when operating in saturation.

As shown in FIG. 1, flip-flop circuit 100 contains two levels of bipolar junction transistors (BJT) within several of the current paths extending between the power supply (VPWR) and ground (GND) nodes. Because of it's two level (i.e., stacked) architecture, flip-flop circuit 100 cannot operate at relatively low supply voltages. For the purpose of this disclosure, a "relatively low supply voltage" will be interpreted as a supply voltage of approximately 1.8 volts or lower. Therefore, one disadvantage of flip-flop circuit 100 is the high power supply requirement necessitated by it's two level BJT architecture. For example, the minimum supply voltage needed to operate flip-flop circuit 100 may be expressed as:

$$VPWR\min \approx IR + 2V_{BE} + V_{Ci} \qquad \text{EQ. 2}$$

where IR is the swing voltage, or the IR (current times resistance) drop over one of the pull up resistors (R1, R2, R3 or R4), $V_{BE}$ is the base-emitter voltage of an NPN transistor, and $V_{Ci}$ is the voltage drop across one of the current sources (C1 or C2). In one exemplary embodiment, the minimum supply voltage of flip-flop circuit 100 may be approximately 2.4V, assuming a base-emitter voltage $(V_{BE})$ of 0.9V, a swing voltage of 300 mV and a voltage drop of 300 mV across the current source.

Due to its high power supply requirement (e.g., about 2.4 volts), flip-flop circuit 100 cannot be used within low power supply circuits, such as those requiring less than about 1.8 volts. Flip-flop circuit 100 also fails to provide SET/RESET capability, and therefore, cannot be used within circuits or devices requiring such functionality (e.g., PFD circuits). As another potential disadvantage, the voltage level of one or more signals input to flip-flop circuit 100 may be substantially different from the voltage level of the output signals generated by flip-flop circuit 100. In other words, problems may arise when input signals with CMOS voltage swings (e.g., CLK/CLKbar) are supplied to a flip-flop circuit that generates output signals with ECL/CML voltage swings (e.g., "Q" and "Qbar"). For example, differences between input and output voltage swings may prohibit the use of auto-routing devices, which are often used for electrically connecting circuit components on a semiconductor chip. If large CMOS voltage swings are supplied to the second stage input, they may cause the base collector junction diode to become forward biased, thereby killing the switching function of differential transistors N7 and N8.

For at least these reasons, a need remains for an improved flip-flop circuit that can be used with relatively low supply voltages. In a preferred embodiment, the improved flip-flop circuit may include SET and/or RESET functions to allow the flip-flop circuit to be used within applications requiring such functionality. In addition, means may be included for limiting the voltage swing of one or more input signals supplied to the improved flip-flop circuit. Such means may be included, e.g., to improve the operating speed and/or enable the use of auto-routing devices when incorporating the flip-flop onto a semiconductor chip.

SUMMARY OF THE INVENTION

The problems outlined above may be in large part addressed by a low voltage flip-flop circuit with asynchronous SET and/or RESET functions. The flip-flop circuit described herein improves upon existing low voltage architectures by providing SET/RESET capability to a flip-flop circuit that can operate at relatively low supply voltages (e.g., less than about 1.8V). In doing so, the improved flip-flop circuit may be used within a phase frequency detector, programmable counter, and/or frequency divider of a phase locked loop (PLL) or delay locked loop (DLL) device. However, the improved flip-flop circuit may be used with any low voltage circuit or device that may require, use or benefit from an asynchronous SET or RESET function. In some cases, the input levels of the low voltage flip-flop may comprise ECL/CML, TTL and/or CMOS logic levels, among others.

A logic circuit is provided in one embodiment of the invention. The logic circuit may be coupled between a power supply node and a ground node. In some embodiments, the logic circuit may include a plurality of bipolar junction transistors (BJTs), though field effect transistors (FETs) may be used in other embodiments of the invention. In order to achieve a low voltage design, each current path extending between the power supply and ground nodes may include no more than one base-emitter junction (or no more than one gate-source junction, if FETs are used). In other words, the low voltage flip-flop circuit described herein may include no stacked transistors.

In some embodiments, the plurality of bipolar junction transistors may include a first pair of transistors for receiving a pair of differential input signals, and a second pair of transistors for receiving a pair of differential latch signals generated by the first pair of transistors. The first and second pairs of transistors may be controlled by a pair of differential clock signals supplied to the logic circuit. To provide SET/RESET functionality, the plurality of bipolar transistors may include a third pair of transistors, coupled in parallel between the first and second pairs of transistors. The third pair of transistors may be controlled by at least one of a SET signal and a RESET signal. In this manner, the third pair of transistors may be configured for changing the polarity of at least one of the pair of differential latch signals when the SET signal or the RESET signal is asserted.

In some embodiments, a collector terminal of one of the transistors within the third pair of transistors may be coupled to VCC, while the collector terminal of the other is coupled to the collector terminal of a transistor within the first pair of transistors. Emitter terminals of the third pair of transistors may be separately coupled to the emitter terminals of the first and second pairs of transistors and to a pair of constant current sources. To provide SET or RESET functionality, the base terminals of the third pair of transistors may be coupled for receiving the SET or the RESET signal.

In other embodiments, however, the collector terminals of the third pair of transistors may be coupled to collector terminals of the first pair of transistors, while the emitter terminals of the third pair of transistors are coupled to a constant current source. A base terminal of one of the third pair of transistors may also be coupled to the constant current source, while the base terminal of the other is coupled through a pull-up resistor to the power supply node. To provide SET or RESET functionality, the logic circuit may include three additional transistors, each coupled in a common-emitter configuration with a different one of the first, second and third pairs of transistors. In some cases, the additional transistors coupled to the first and second pairs of transistors may be coupled for receiving the same signal, either the SET signal or the RESET signal, at a base terminal thereof. However, the additional transistor coupled to the third pair of transistors may be coupled for receiving a complementary version of the SET or RESET signal at a base terminal thereof. As such, the current embodiment may cover the case in which a differential SET signal or a differential RESET signal is supplied to the logic circuit.

In some embodiments, one or more level shift circuits may be included within the logic circuit for reducing the voltage swings of one or more signals supplied to the logic circuit. In some cases, a first level shift circuit may be included for reducing a voltage swing of the differential clock signals. As such, additional transistors may be coupled in common-emitter configurations with the first and second pairs of transistors for receiving level shifted versions of the clock and complementary clock signals, respectively. In some cases, a second level shift circuit may also be included for reducing a voltage swing of the differential SET signal or the differential RESET signal. As such, additional transistors may be coupled in common-emitter configurations with the first and second pairs of transistors for receiving a level shifted version of the SET (or RESET) signal, while another additional transistor is coupled in a common-emitter configuration with the third pair of transistors for receiving a level shifted version of the complementary SET (or complementary RESET) signal.

According to another embodiment, a flip-flop circuit is described herein as including a master latch and a slave latch, each being coupled between a power supply node and a ground node. In general, the master and slave latches may each include a plurality of transistors. In order to operate at relatively low supply voltages (e.g., less than about 1.8 volts), no stacked transistors may be included within any current path extending between the power supply and ground nodes.

In some embodiments, the master latch may include a first pair of differential input transistors for receiving a pair of differential input signals supplied to the flip-flop circuit; a first pair of cross-coupled transistors for receiving a pair of differential latch signals generated by the first pair of differential input transistors; and at least one transistor coupled between the first pair of differential input transistors and the first pair of cross-coupled transistors. The at least one transistor may be added to provide either a SET or a RESET function, and as such, may be controlled by at least one of a SET or a RESET signal.

In some cases, the at least one transistor may include a pair of SET (or RESET) transistors, one of which is coupled for changing the polarity of one of the differential latch signals, depending on a state of the SET (or RESET) signal and a state of another one of the differential latch signals. The other transistor in the pair may be coupled for disabling the first pair of differential input transistors during times when the SET or RESET signal is asserted. In such a case, the pair of transistors may be included for providing only the SET or the RESET function.

In other cases, the at least one transistor may include three transistors, each coupled in a common-emitter configuration. For example, one of the three transistors may be a SET (or RESET) transistor coupled for changing the polarity of one of the differential latch signals when a SET (or RESET) signal is asserted. The other two transistors may be coupled for activating the SET (or RESET) transistor and/or for providing a matching capacitance. Similar to the case above, the three transistors may be included for providing only the SET or the RESET function.

In yet other cases, the at least one transistor may include two separate pairs of SET and RESET transistors, each coupled in parallel between the first pair of differential input transistors and the first pair of cross-coupled transistors for receiving the SET signal and the RESET signal, respectively. For example, the pair of SET transistors may be coupled for changing the polarity of a first one of the differential latch signals, depending on a state of the SET signal and a state of a second one of the differential latch signals. On the other hand, the pair of RESET transistors may be configured for changing the polarity of the second one of the differential latch signals, depending on a state of the RESET signal and a state of the first one of the differential latch signals. In this manner, the two pairs of SET and RESET transistors may be included for providing both SET and RESET functions.

In some embodiments, one or more level shift circuits may be appended to the front end of the flip-flop circuit for reducing the voltage swings of one or more signals supplied thereto. In some cases, a first level shift circuit may be coupled for producing level shifted versions of the differential clock signals by reducing a voltage swing of clock and complementary clock signals supplied to the first level shift circuit. As a result, additional transistors may be coupled to the first pair of differential transistors for receiving the level shifted versions of the clock and complementary clock signals. In some cases, a second level shift circuit may also be coupled for producing level shifted versions of the differential SET or RESET signals by reducing a voltage swing of the differential SET or RESET signals supplied to the second level shift circuit. This may require even more additional transistors. For example, additional transistors may be coupled to the first pair of differential input transistors and the first pair of cross-coupled transistors for receiving the level shifted version of the SET (or RESET) signal. Yet another additional transistor may be coupled to the at least one transistor for receiving the level shifted version of the complementary SET (or complementary RESET) signal. The opposite may be true in other embodiments of the invention.

The slave latch of the flip-flop circuit may be coupled in series with the master latch. Similar to the master latch, the slave latch may include a second pair of differential input transistors for receiving the pair of differential latch signals; a second pair of cross-coupled transistors for receiving a pair of differential output signals generated by the second pair of differential input transistors; and at least one transistor coupled between the second pair of differential input transistors and the second pair of cross-coupled transistors. The at least one transistor may be added to provide either a SET or a RESET function, and as such, may be controlled by at least one of a SET or a RESET signal.

According to yet another embodiment, a phase-locked loop device is described herein as including at least one flip-flop circuit having a plurality of transistors coupled between a power supply node and a ground node. To provide low voltage operation, each current path extending between the power supply and ground nodes includes no stacked transistors. At least one of the plurality of transistors may be configured for receiving a SET or a RESET signal to provide SET and/or RESET functionality.

In general, the phase-locked loop device may include a phase frequency detector (PFD), a loop filter and a voltage controlled oscillator. The PFD may be generally configured for receiving and comparing a feedback clock signal to a reference clock signal and for generating an error signal representative of the difference therebetween. The loop filter may be coupled to the phase frequency detector for filtering the error signal, whereas the voltage controlled oscillator may be coupled for using the filtered error signal to adjust a frequency and/or phase of one or more clocking signals generated by the voltage controlled oscillator. In some cases, a frequency divider circuit may be included for reducing the frequency of one of the clocking signals generated by the voltage controlled oscillator before the reduced frequency clocking signal is sent to the phase frequency detector as the feedback signal.

In a preferred embodiment, at least one flip-flop circuit may be included with the phase frequency detector, along with an additional flip-flop circuit substantially identical to the at least one flip-flop circuit. However, the flip-flop circuit should not be limited to PFD circuits, and may be additionally or alternatively included within one or more frequency divider circuits. For example, the flip-flop circuit described herein may be used within a programmable counter included, e.g., within an output frequency divider or feedback frequency divider of the PLL device. The flip-flop circuit may also be used within delay locked loop (DLL) devices, in other embodiments of the invention.

BRIEF DESCRIPTION OF THE DRAWINGS

Other objects and advantages of the invention will become apparent upon reading the following detailed description and upon reference to the accompanying drawings in which.

Figure 1:
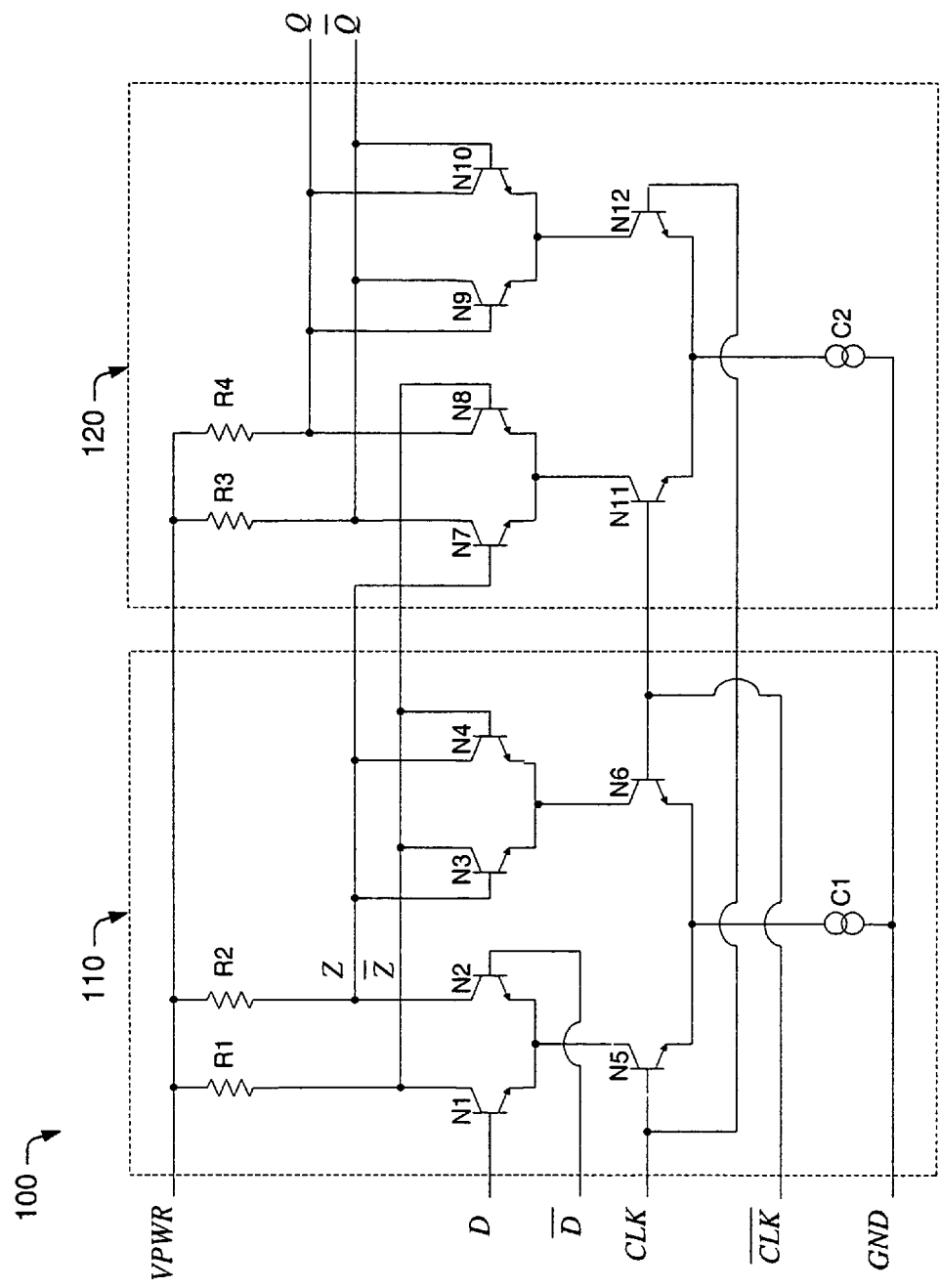
FIG. 1 is a circuit diagram illustrating one embodiment of a D-type flip-flop circuit with high power supply voltage requirements and no SET or RESET capability.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 2:
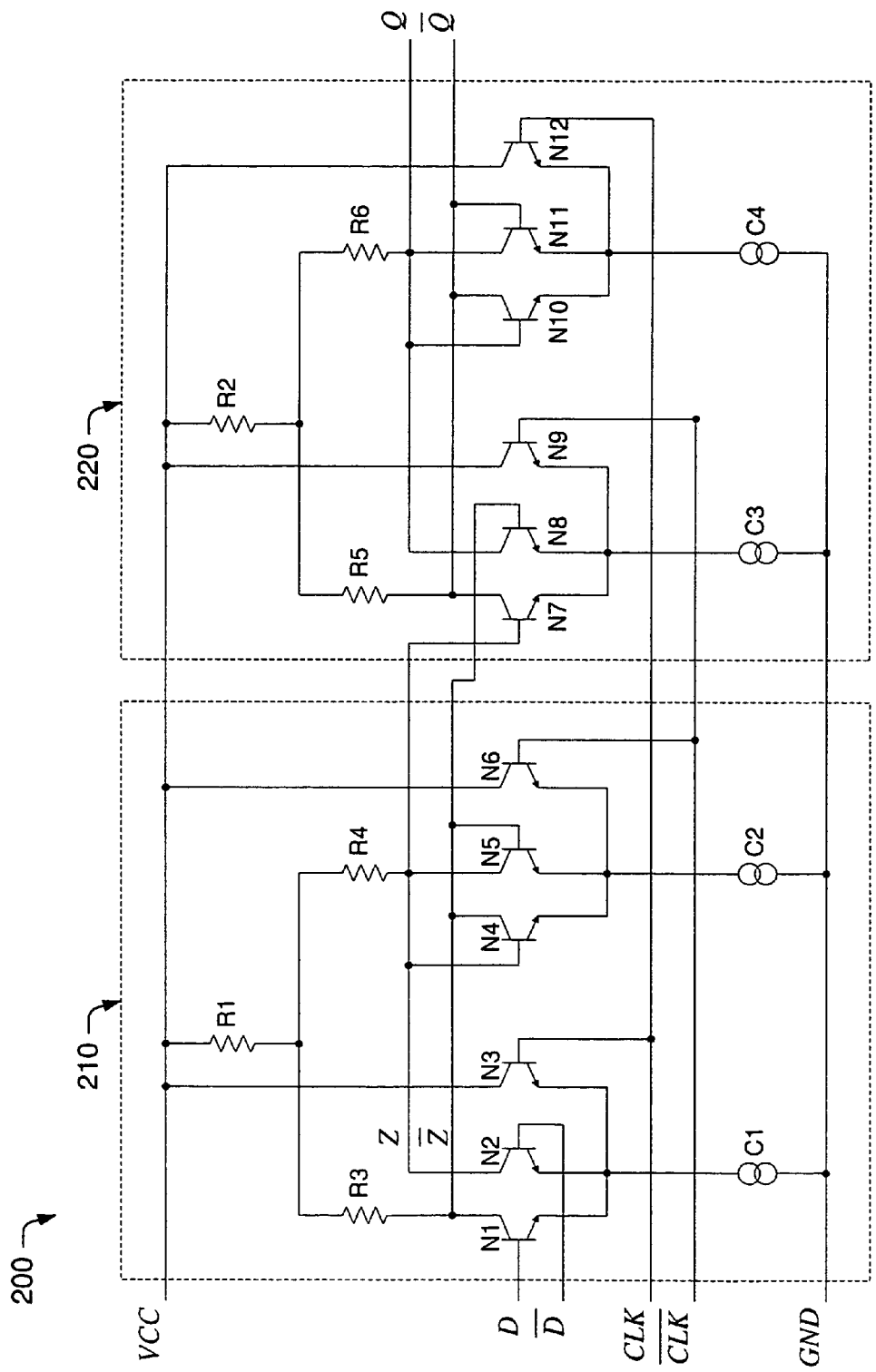
FIG. 2 is a circuit diagram illustrating one embodiment of a low voltage flip-flop circuit without SET or RESET capability.

FIG. 2 illustrates another example of a conventional flip-flop circuit 200. Similar to the flip-flop circuit of FIG. 1, the current solution comprises master latch 210 and slave latch 220, each comprising six transistors. However, flip-flop circuit 200 includes no "stacked" transistors, and thus, includes no more than one base-emitter junction within any current path extending between the power supply (VCC) and ground (GND) nodes. For this reason, flip-flop circuit 200 may be generally configured for operating at relatively low supply voltages, such as those below approximately 1.8 volts. The concept of a low voltage flip-flop was first published in a paper written by Razavi, entitled "Design Techniques for Low-Voltage High-Speed Digital Bipolar Circuits," and appearing in the IEEE Journal of Solid-State Circuits, Vol. 29, pp. 332–339, March 1994. Details of the implementation and operation of flip-flop circuit 200 may be found in the Razavi paper, which is incorporated herein in its entirety.

Though Razavi discloses a low-voltage flip-flop circuit design, Razavi does not disclose a method for setting and/or resetting this type of flip-flop circuit. As a result, the flip-flop circuit of FIG. 2 cannot be used within a phase frequency detector, or any other circuit or device requiring either SET, RESET or SET/RESET functionality. Examples of circuitry requiring such functionality may also include common state machine designs, counters, or any logic designs that require a set/reset storage element.

Figure 3:
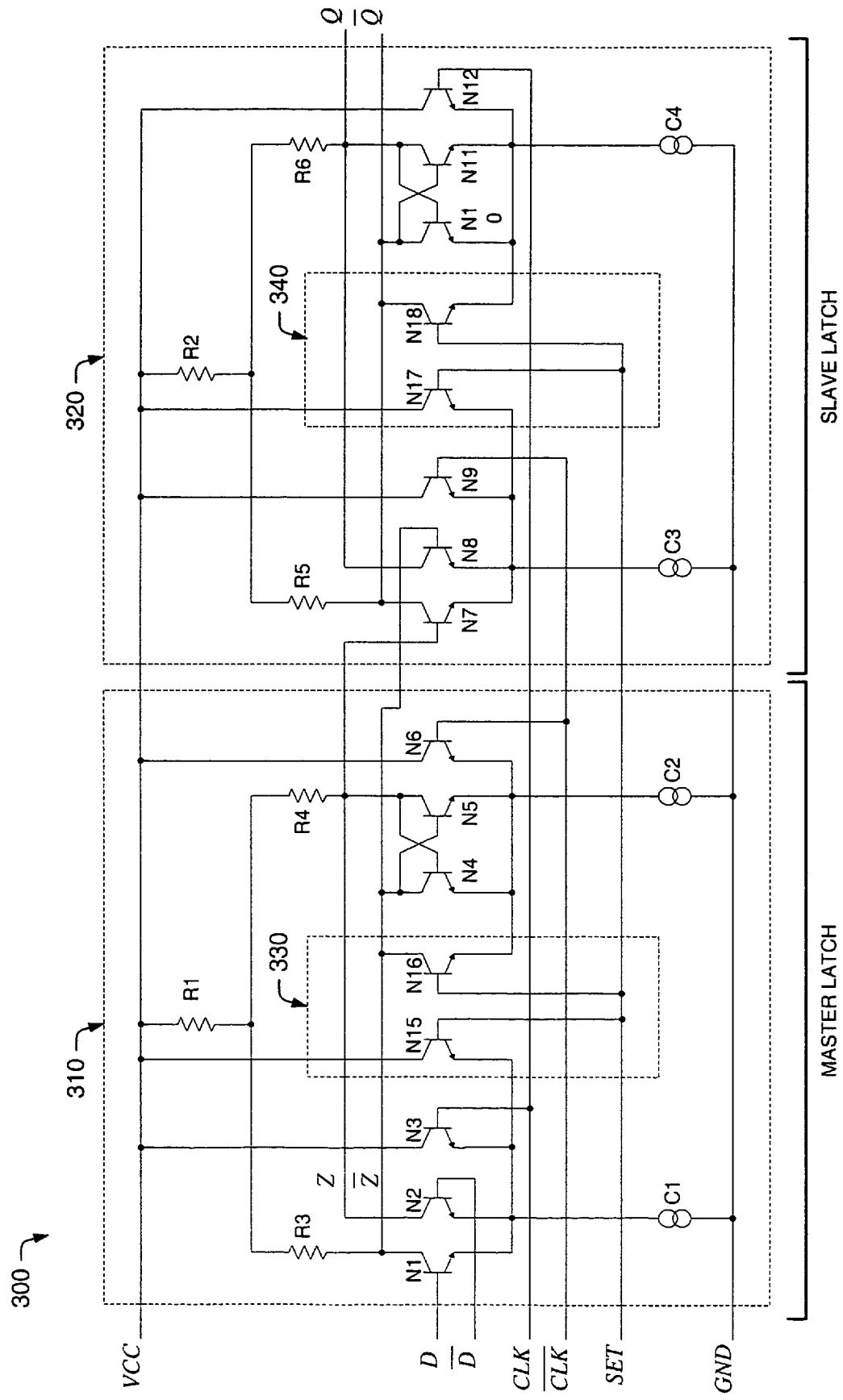
FIG. 3 is a circuit diagram illustrating a low voltage flip-flop circuit with SET/RESET capabilities, according to one embodiment of the invention.
Figure 4:
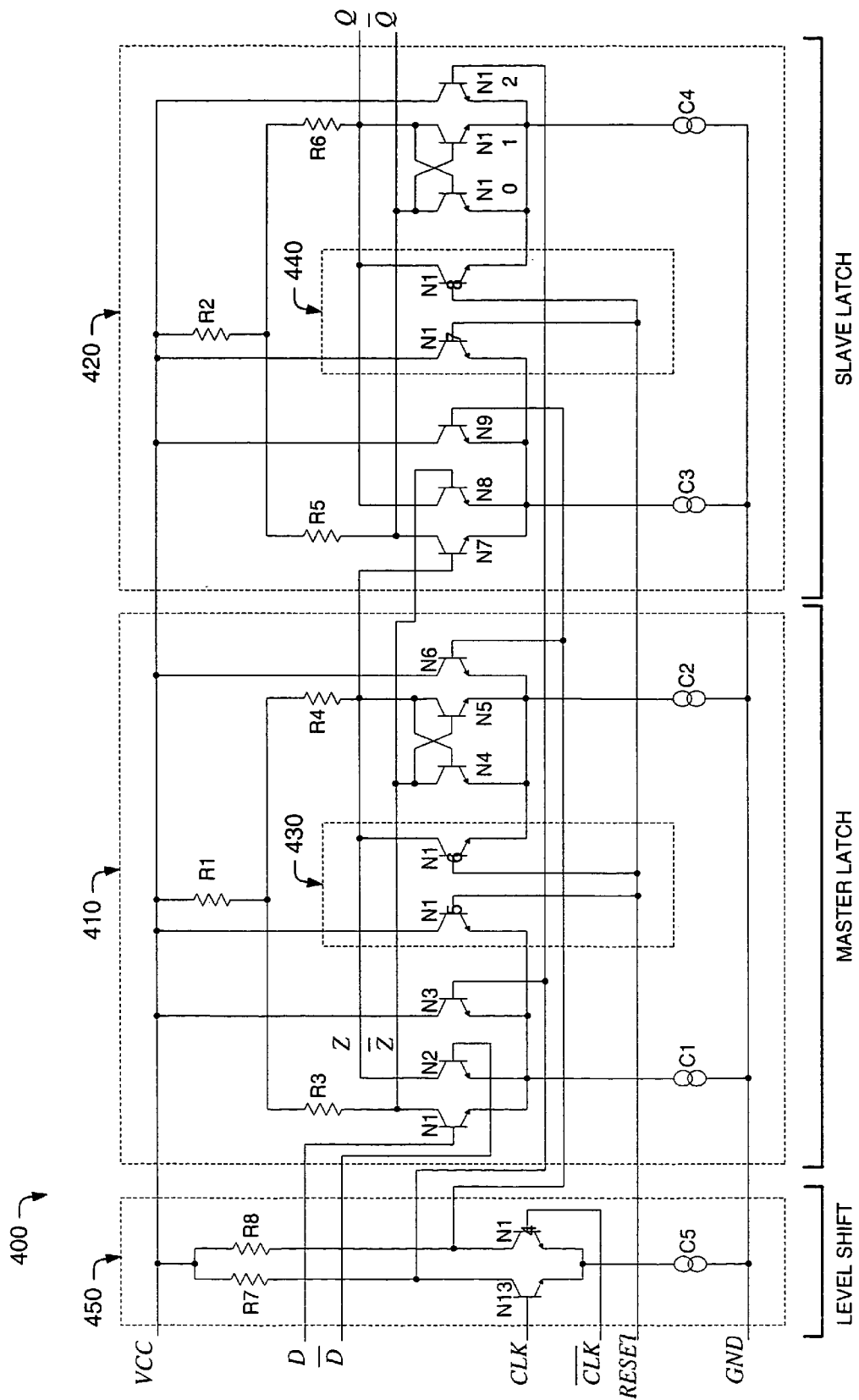
FIG. 4 is a circuit diagram illustrating a low voltage flip-flop circuit, according to another embodiment of the invention, including SET/RESET capabilities and a level shift circuit for reducing the voltage swing of a pair of clocking signals.
Figure 10:
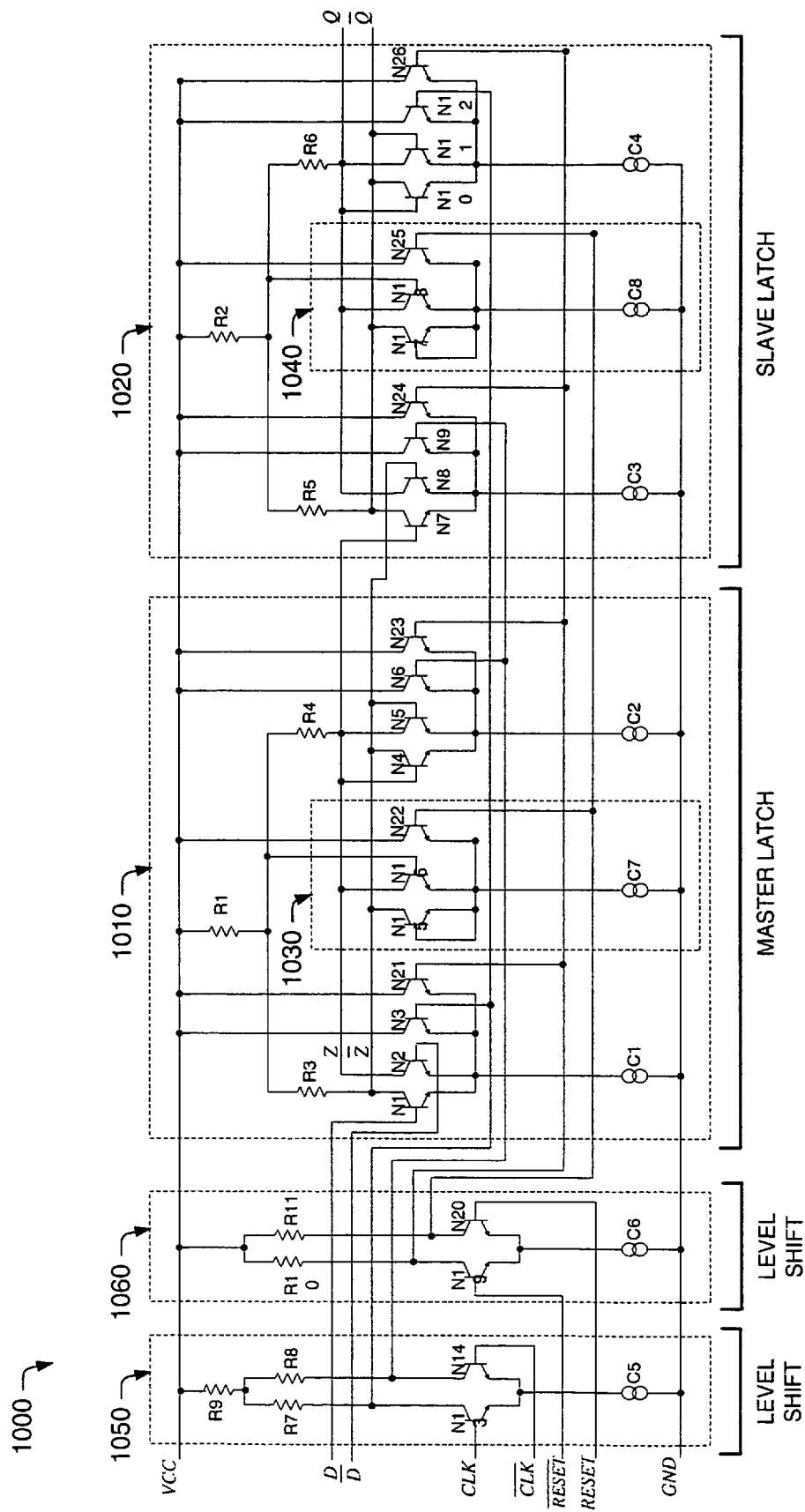
FIG. 10 is a circuit diagram illustrating a low voltage flip flop circuit, according to yet another embodiment of the invention, including SET/RESET capabilities, a means for reducing the voltage swing of a pair of clocking signals, and means for reducing the voltage swing of the SET/RESET signals.

Various embodiments of an improved flip-flop circuit and method are shown in FIGS. 3, 4 and 10. As will be described in more detail below, the flip-flop circuits of FIGS. 3, 4 and 10 generally improve upon the low voltage design of FIG. 2 by adding at least two extra pairs of bipolar junction transistors (BJTs) within the master and slave portions of the flip-flop circuit to implement the SET or the RESET function.

In the embodiment shown in FIG. 3, a first pair of SET transistors includes transistors N15 and N16, whereas a second pair of SET transistors includes transistors N17 and N18. However, transistors N15, N16, N17 and N18 may be alternatively configured as RESET transistors, as shown in the embodiment of FIG. 4. It is noted that alternative embodiments of the invention may include only one SET transistor or one RESET transistor within the master and slave portions of the circuit for implementing either the SET or the RESET function. In addition, it may be possible to include a pair of SET transistors and a pair of RESET transistors within the master and slave portions of the circuit, so as to provide both SET and RESET functionality. These embodiments are not illustrated for the sake of brevity; however, they are considered to be included within the ordinary scope of the invention.

One embodiment of a low voltage flip-flop circuit with SET functionality is shown in FIG. 3. In general, flip-flop circuit 300 includes master latch 310 and slave latch 320. For example, master latch 310 may include a pair of differential input transistors (N1, N2) and a pair of cross-coupled transistors (N4, N5). As used herein, a cross-coupled connection may be carried out by electrically connecting the collector terminal of each transistor in a pair of transistors to the base terminal of the opposite transistor in the pair. In some cases, cross-coupled transistors (N4, N5) may alternatively be referred to as a "latch pair."

As shown in FIG. 3, differential transistors (N1, N2) and cross-coupled transistors (N4, N5) are each coupled in series between the power supply (VCC) and ground (GND) nodes of flip-flop circuit 300. For example, differential transistors (N1, N2) and cross-coupled transistors (N4, N5) are each coupled in a common-emitter configuration. The differential and cross-coupled transistors are then independently coupled between VCC (via resistors R1, R3, and R4) and a constant current source (e.g., C1 or C2), which in turn, is connected to GND. The current sources may be used to supply a constant current to the emitter terminals of the differential and cross-coupled transistors, so as to avoid saturating those transistors. The differential and cross-coupled transistors are also coupled in parallel with each other. For example, a collector terminal of differential transistor N1 is coupled to a collector terminal of cross-coupled transistor N4 (similar connections are made between differential transistor N2 and cross-coupled transistor N5).

In the embodiment of FIG. 3, the differential and cross-coupled transistors are controlled by a pair of differential clock signals ("CLK" and "CLKbar") via transistors N3 and N6. In other words, transistors N3 and N6 are each coupled in a common-emitter configuration with one of the differential and cross-coupled transistor pairs. As shown in FIG. 3, transistor N3 may be configured for receiving the clock signal (CLK), whereas transistor N6 may be configured for receiving the complementary clock signal (CLKbar), at respective base terminals thereof. Flip-flop circuit 300 may, therefore, be considered a "clocked" or "synchronous" flip-flop.

The slave portion of flip-flop circuit 300 is coupled in series with the master portion and may be configured in substantially the same manner as the master portion. As such, slave portion 320 may include a pair of differential transistors (N7, N8) and a pair of cross-coupled transistors (N10, N11), each coupled in series between the power supply (VCC) and ground (GND) nodes of the flip-flop circuit, and coupled in parallel with each other. Transistors N9 and N12 may be coupled to the differential and cross-coupled transistors for receiving the pair of differential clock signals. For example, transistor N9 may receive the complementary clock signal (CLKbar), whereas transistor N12 may receive the clock signal (CLK), at respective base terminals thereof. Furthermore, constant current sources (C3 and C4) may be coupled between the emitter terminals of transistors N7, N8, N9 and ground, and between the emitter terminals of transistors N10, N11, N12 and ground, to keep those transistors in a current mode of operation.

As noted above, flip-flop circuit 300 improves upon flip-flop circuit 200 by including at least two extra pairs of bipolar junction transistors 330, 340 for implementing the SET function. In the embodiment of FIG. 3, transistors N15 and N16 are included within master latch 310, whereas transistors N17 and N18 are included within slave latch 320. Transistors N15, N16, N17, and N18 are each coupled for receiving the SET signal at respective base terminals thereof. Therefore, transistors N15, N16, N17, and N18 may be referred to herein as "SET transistors". As described below, however, flip-flop circuit 300 may be modified to provide RESET transistors N15, N16, N17, and N18, in other embodiments of the invention. Since the implementation and operation of bipolar transistor pairs 330 and 340 are essentially the same, the following discussion will focus on transistor pair 330 for the sake of brevity.

In the embodiment of FIG. 3, the emitter terminals of SET transistors N15 and N16 are coupled to the emitter terminals of transistors N1, N2, N3 and transistors N4, N5, N6, respectively. In this configuration, the SET transistors may be driven by the same current sources (C1 and C2) driving transistors N1, N2, N3 and transistors N4, N5, N6. However, the SET transistors may be alternatively driven by a separate current source, in other embodiments of the invention (see, e.g., FIG. 10). In FIG. 3, the collector terminal of transistor N15 is coupled to VCC, while the collector terminal of transistor N16 is coupled to the collector terminal of differential input transistor N1. As a result, SET transistor N16 may be configured for changing the polarity of a complementary latch signal ("Zbar") generated by differential transistor N1, depending on a state of the SET signal and a state of the latch signal ("Z") generated by differential transistor N2.

In alternative embodiments of the invention, transistors N15, N16, N17 and N18 may be configured for providing a RESET, instead of a SET function. For example, the collector terminal of transistor N16 may, instead, be coupled to the collector terminal of differential transistor N2, as shown in the embodiment of FIG. 4 (similar modifications may be made for transistor N18). In this manner, RESET transistor N16 may be configured for changing the polarity of the latch signal ("Z") generated by differential transistor N2, depending on a state of the RESET signal and a state of the complementary latch signal ("Zbar") generated by differential transistor N1. The differential latch signals ("Z" and "Zbar") generated by master latch 310, as well as the differential output signals ("Q" and "Qbar") generated by slave latch 320, will be described in more detail below.

The improved flip-flop circuit of FIG. 3 may operate in the following manner. In the master latch of FIG. 3, differential transistors (N1, N2) are controlled by the CLK signal, whereas cross-coupled transistors (N4, N5) are controlled by the CLKbar signal. The clock signals are supplied differently in the slave latch, where differential transistors (N7, N8) are controlled by the CLKbar signal and cross-coupled transistors (N4, N5) are controlled by the CLK signal. In this configuration, the master latch may change states on rising edges of the CLK signal (i.e., when the CLK signal goes high), while the slave latch changes states on falling edges of the CLK signal (i.e., when the CLK signal goes low). It is noted that the opposite may be true in alternative embodiments of the invention. However, the determination to change states may depend, at least in part, on the state of the SET and RESET signals.

For example, master portion 310 and slave portion 320 may periodically change from one state to another, depending on the state of the clock signals ("CLK" and "CLKbar") and the state of the differential input signals ("D" and "Dbar") supplied to the master latch. This periodic change in state generally occurs when the SET/RESET signals are deasserted (e.g., when the SET/RESET signals are logic low). Once a SET or RESET signal is asserted, however, the master and slave portions may be automatically set or reset to a logic high or logic low condition, respectively. Because the SET and RESET signals are asynchronous signals, they may be asserted at any time without waiting for the next transition of the clock pulse to arrive. However, the SET and RESET signals are complementary, and therefore, cannot be asserted at the same time. Though the following discussion focuses on the operation of flip-flop circuit 300 during times in which the SET signal is asserted, it is noted that the RESET function can be alternatively implemented by connecting the collector terminals of transistors N16 and N18 in the manner shown in FIG. 4. The assertion of the SET and RESET signals may generally depend on the manner in which the flip-flop circuit is being used, and therefore, may differ from the description provided below.

When the SET signal is de-asserted, the flip-flop circuit may operate in a normal manner by periodically changing state on rising (or falling) transitions of the clock signal, depending on the state of the differential data input signals ("D" and "Dbar"). The SET signal can be de-asserted by connecting the SET inputs of the flip-flop circuit to ground, or any voltage lower than the CLK and D signals. If the SET function is employed, the SET inputs of the flip-flop circuit can be switched to VCC, or any voltage higher than the CLK and D input signals. Therefore, one advantage of the presently described flip-flop circuit is the ability to directly connect the asynchronous SET (or RESET) inputs to any CMOS logic gate. Because the SET and RESET control signals are usually obtained from CMOS logic blocks, the internal level shifting capability provided by the flip-flop circuit enables the circuit designer to directly tie the control signals to the input ports of the flip-flop circuit without the need for an off-chip CMOS/CML translator.

Once the SET signal is asserted, SET transistor N15 turns "on" to disable the differential input transistors (N1, N2 and N3) in the master stage. SET transistor N16 also turns "on" to disable the latch transistors (N4, N5 and N6) in the master stage. In doing so, the Zbar node is pulled low by SET transistor N16, while the Z node is pulled high by resistors R1 and R4. This forces a logic high value to be latched from the Z output node of the master stage. In the slave stage, differential input transistors N7, N8 and N9 are disabled by SET transistor N17 when the SET signal is asserted. The Qbar node is pulled low, while the Q output is forced to a logic high state. Thus, whenever the SET signal is asserted, flip-flop circuit 300 may be asynchronously set to a logic high state regardless of the state of the clock and data signals.

In order for the SET signal to force the flip-flop circuit into a SET state, a voltage swing of the SET signal must be larger than that of the differential clock and data signals. For example, the SET signal may be driven at CMOS levels, while the clock and data signals are driven with substantially smaller voltages (e.g., ECL/CML signal levels). In other words, the SET function may be implemented by tying the SET signal to VCC, or any other voltage greater than the clock and data signals. This will ensure that the high side of the SET signal voltage swing will be at a substantially higher potential than that of the clock and data signals.

In order to effectively control the timing of the input and latch transistors, the voltage swing of the differential clock signals may be larger than that of the differential data signals. As shown in FIG. 3, for example, common mode resistors (R1 and R2) may be included within the master and slave portions of the flip-flop circuit for shifting the common mode voltage of the output signals (Z/Zbar and Q/Qbar) away from the supply voltage. This may allow the clocking transistors (e.g., N3 and N6) to control the input and latch transistors (e.g., N1, N2 and N4, N5) by reducing the turn-on potential of the differential data signals relative to the clock signals.

One embodiment of an improved flip-flop circuit has now been described in reference to FIG. 3. The improvements made herein provide many advantages over conventional flip-flop circuits. One advantage is the reduced supply voltage needed for operating the improved flip-flop circuit. As shown in FIG. 3, for example, flip-flop circuit 300 includes no stacked transistors, and therefore, contains no more than one base-emitter junction within any current path extending between VCC and GND. Thus, the minimum supply voltage needed to operate flip-flop circuit 300 may be approximately:

$$VCC_{MIN} \approx IR + V_{BE} + V_{Ci} \quad \text{EQ. 3}$$

where IR is the voltage drop across the pull up resistors (e.g., R1,R3 or R1,R4), $V_{BE}$ is the base-emitter voltage of an NPN transistor, and $V_{Ci}$ is the voltage drop across one of the current sources (e.g., C1, C2, C3 or C4). In one exemplary technology, the minimum supply voltage of flip-flop circuit 300 may be reduced to approximately 1.5V by including no more than one base-emitter junction within any current path (assuming, e.g., a base-emitter voltage of 0.9V and 300 mV voltage drops across the pull-up resistors and current source). Thus, flip-flop circuit 300 may be used within numerous low voltage applications that require or benefit from using supply voltages of less than about 1.8 volts.

Flip-flop circuit 300 provides another advantage by combining SET functionality within a low-voltage circuit design. As noted above, SET, RESET or SET/RESET functionality may be provided within the flip-flop circuits described herein by adding one or more SET and/or RESET transistors within the master and slave portions of the flip-flop circuit. Though flip-flop circuit 300 includes only SET transistors, both SET and RESET transistors may be included, in alternative embodiments of the invention, for implementing the SET and RESET functions.

Yet another advantage is provided in flip-flop circuit 300 by including common mode resistors (R1 and R2) within the master and slave portions of the flip-flop circuit. As note above, the common mode resistors may be included for ensuring that the voltage swing of the data signals is smaller than that of the clocking signals, thereby guaranteeing synchronous flip—flip operation when the SET signal is de-asserted (i.e., when the low side of the SET signal voltage swing is lower than that of the clock and data signals).

The improved flip-flop circuit shown in FIG. 4 provides yet another improvement over the conventional circuits shown in FIGS. 1 and 2. As shown in FIG. 4, flip-flop circuit 400 includes master portion 410 and slave portion 420. Since the implementation and operation of the master and slave portions of flip-flop circuit 400 are substantially identical to those of flip-flop circuit 300, they will not be repeated below for the sake of brevity. It is noted, however, that one or more SET and/or RESET transistors may be included within the master and slave portions of low voltage flip-flop circuit 400 to provide the desired functionality. In addition to the advantages described above, level shift circuit 450 is included at the front end of flip-flop circuit 400 for reducing a voltage swing of the differential clock signals (CLK and CLKbar) supplied thereto. As described in more detail below, level shift circuit 450 provides many advantages, some of which may include increased operating speed and the capability for using auto-routing devices when incorporating the flip-flop circuit onto a semiconductor chip. Other advantages may become apparent in light of the following disclosure.

As shown in FIG. 4, level shift circuit 450 may include one or more pull up resistors (R7 and R8), a pair of differential transistors (N13 and N14), and a constant current source (C5). Alternative means for implementing level shift circuit 450 are possible and within the scope of the invention. In FIG. 4, however, the pull up resistors, differential transistors and current source are generally coupled in series between the power supply (VCC) and ground (GND) nodes of the flip-flop circuit. For example, resistor R7 may be coupled between VCC and a collector terminal of differential transistor N13, whereas resistor R8 may be coupled between VCC and a collector terminal of differential transistor N14. The emitter terminals of differential transistors N13 and N14 may be coupled together for receiving a constant current from current source C5. Thus, differential transistors N13 and N14 may each be configured for maintaining a current mode of operation. When the differential clock signals (CLK and CLKbar) are supplied to the base terminals of differential transistors N13 and N14, they are level shifted by resistors R7 and R8. For example, voltage swings of the CLK and CLKbar signals may be reduced by the voltage drops across resistors R7 and resistor R8, respectively. In some cases, resistors R7 and R8 may be substantially identical, so that the voltage swings of the differential clock signals are reduced by substantially equal amounts.

As noted above, it is often desirable for the clock signal swings to be larger than that of the data signals, so that normal changes in state can be properly synchronized with transitions of the clock. This may be achieved, in some respects, by adding common mode resistors (R1 and R2) within the master and slave portions of the flip-flop circuit to effectively shift the common mode voltage of the differential data signals away from the supply voltage. With the addition of level shift circuit 450, the desired clock swings can be maintained by ensuring that the resistance of each resistor (R7 and R8) in the level shift circuit is larger than the sum of R1 and R3 (assuming, of course, that current sources C1 and C5 are substantially equal in value). In doing so, the low side of the data signal voltage swing will be lower than that of the clock signals, due to the larger voltage drop across resistors R7 and R8. Because level shift circuit 450 does not include a common mode resistor, the high side of the clock signal swing will also be higher than that of the data signals. In some cases, the desired clock swing can be maintained when a common mode resistor is included within level shift circuit 450, if the resistor (not shown) is smaller than the common mode resistors (R1 and R2) used in the master and slave portions of the flip-flop circuit.

By including level shift circuit 450, flip-flop circuit 400 may be adapted for receiving clock and data signals with substantially identical voltage swings. In some cases, for example, CML gates can be used for driving the clock and the data ports of the flip-flop circuit. This may allow an auto-routing device to be used when incorporating the flip-flop circuit onto a semiconductor chip, if the clock and data ports are driven with the same voltage levels output from flip-flop circuit 400. Auto-routing devices are generally desirable for decreasing manufacturing time and human error; however, they cannot be used when input and output voltage swings differ from one another. By including level shift circuit 450, the voltage swing of the differential clock signals can be made larger than that of the differential data signals, even when the clock and data swings input to the flip-flop circuit are substantially identical. The level shift circuit also functions to reduce capacitive loading on the clock lines, which may improve the speed of the flip-flop circuit, especially when incorporated within large system designs.

On the other hand, level shift circuit 450 may enable flip-flop circuit 400 to receive clock and data signals having substantially different voltage swings, in other embodiments of the invention. For example, flip-flop circuit 400 may receive data signals with ECL/CML voltage swings and clocking signals with CMOS voltage swings. By including level shift circuit 450, the CMOS voltage swings of the differential clocking signals may be scaled down toward the ECL/CML voltage swings of the differential input signals. This may eliminate the need for an off-chip CMOS to CML translator.

The improved flip-flop circuit described thus far may be incorporated within a variety of low voltage circuits and devices that require, utilize or otherwise benefit from asynchronous SET and/or RESET functions. For example, the improved flip-flop circuit may be used within a phase locked loop (PLL) or delay locked loop (DLL) device, such as those shown in FIGS. 5 and 6 and described in more detail below. However, many other applications are possible and within the normal scope of the invention.

Phase-locked loops ("PLLs") and delay-locked loops ("DLLs") are routinely used for data and telecommunications, frequency synthesis, clock recovery, and similar applications. For example, a PLL or DLL may be used in the I/O interfaces of digital integrated circuits to hide clock distribution delays and to improve overall system timing. Generally speaking, a PLL or DLL device may be used to generate one or more clocking signals that are in phase alignment with a reference clock. More specifically, a PLL is a closed-loop device that uses a voltage-controlled oscillator (VCO) to obtain accurate phase alignment between the generated clocking signals and the reference signal. A DLL device, on the other hand, generally differs from a PLL device by using a delay line, instead of a VCO, to obtain accurate phase alignment between the clocking and reference signals.

Figure 5:
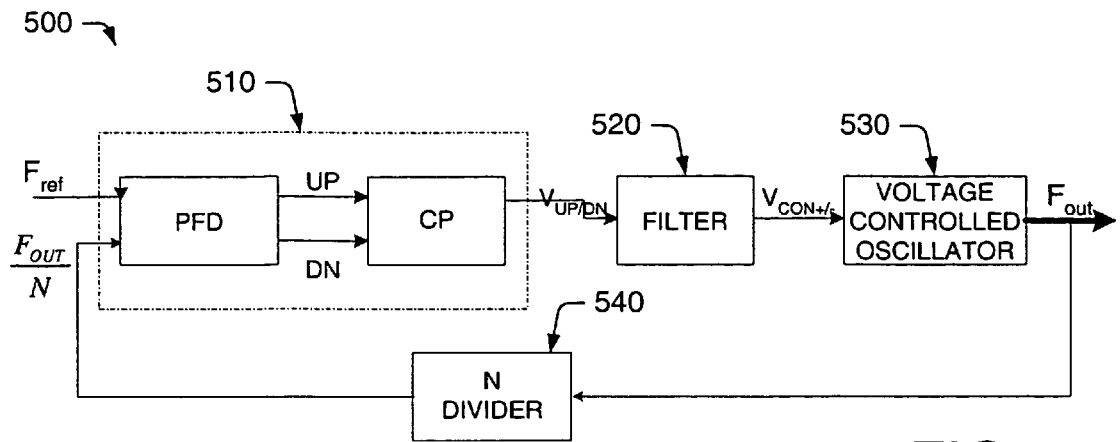
FIG. 5 is a block diagram of a phase locked loop (PLL) device including a Phase Frequency Detector (PFD), a frequency divider and a programmable counter, among other components.

FIG. 5 is a block diagram of a typical PLL device 500 including phase comparator 510, loop filter 520, voltage controlled oscillator (VCO) 530 and frequency divider 540. In some cases, phase comparator 510 may include a phase frequency detector (PFD) and a charge pump (CP); however, a voltage pump (not shown) may be used in alternative embodiments of the invention. During operation, the PFD compares the feedback signal ($F_{OUT}/N$) to the reference signal ($F_{REF}$) and generates a corrective output pulse (e.g., a "pump up" or "pump down" pulse) in response to the phase difference between the reference and feedback signals. As described in more detail below, the corrective output pulse may then be used to "phase lock" the feedback signal to the reference signal.

The corrective "pump up" and "pump down" pulses may then be passed through the charge pump and loop filter 520 to generate a control voltage ($V_{CON+/-}$) for controlling VCO 530. After receiving the control voltage, VCO 530 converts the voltage information into one or more output frequencies ($F_{OUT}$), one of which is sent back, via a negative feedback loop, to the feedback input of the PFD. In the embodiment shown, frequency divider 540 divides the frequency of the VCO output signal to produce the feedback signal ($F_{OUT}/N$). However, frequency divider 540 may not be included in all embodiments of the invention. If frequency divider 540 is omitted, the VCO output signal may be fed back to phase comparator 510 without division.

Figure 6:
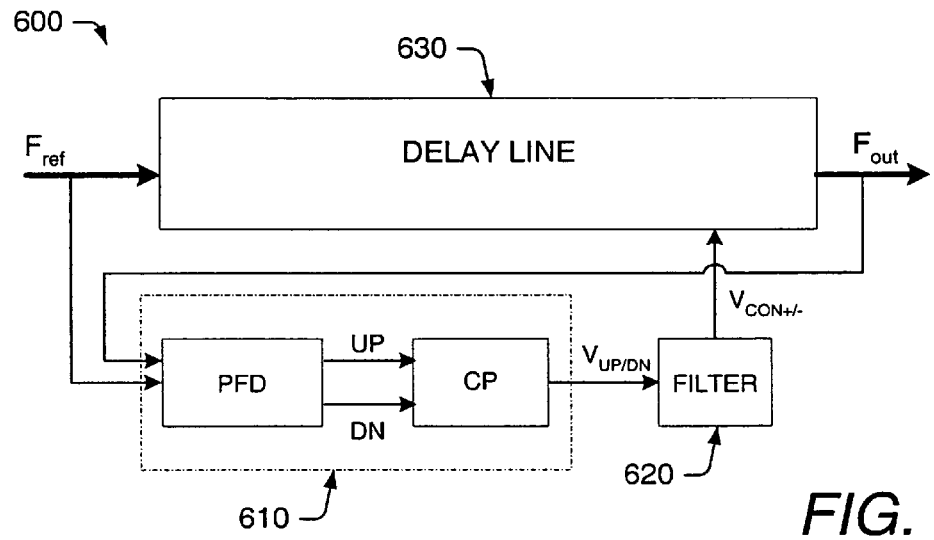
FIG. 6 is a block diagram of a delay locked loop (DLL) device including a Phase Frequency Detector (PFD), among other components.

FIG. 6 is a block diagram of a typical DLL device 600 including phase comparator 610, loop filter 620 and delay line 630. Phase comparator 610 compares the phase of the feedback signal ($F_{OUT}$) to the phase of the reference signal ($F_{REF}$) and generates an error signal, or phase correction signal. In some embodiments, phase comparator 610 may include a phase frequency detector (PFD) and a charge pump (CP). A voltage pump (not shown) may replace the charge pump in alternative embodiments of the invention. Loop filter 620 filters the error signal generated by phase comparator 610 and adjusts the delay of delay line 630 by supplying a differential control signal ($V_{CON+/-}$) to the delay line. Delay line 630 may include substantially any number of delay cells; the delay cells may be coupled in series for receiving an input signal ($F_{REF}$) and producing a delayed version of the input signal ($F_{OUT}$). In this manner, delay line 630 may produce a delay, which is substantially equal to an integer number of the reference clock periods.

Figure 7:
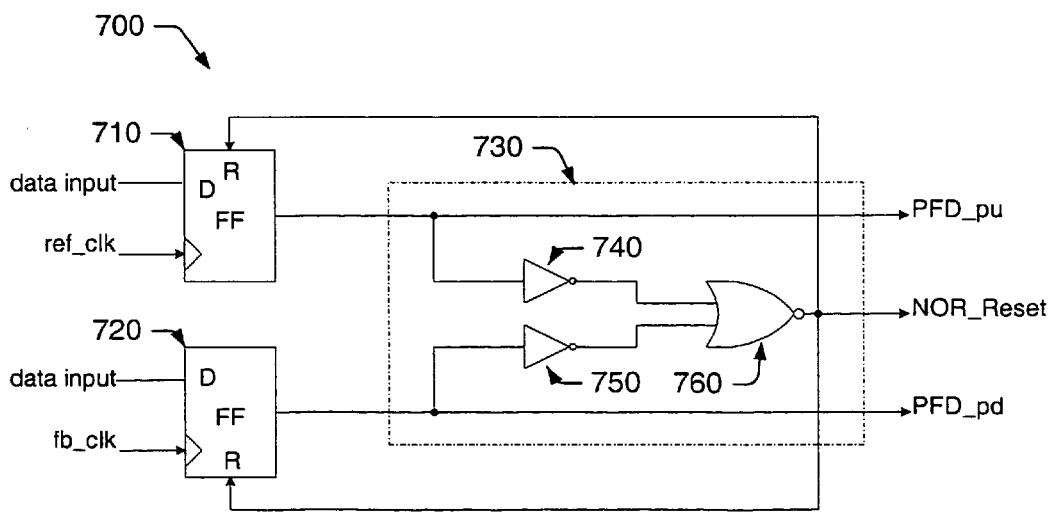
FIG. 7 is a block diagram illustrating an exemplary PFD circuit that may be used within the PLL of FIG. 5 or the DLL of FIG. 6.

FIG. 7 illustrates one embodiment of a PFD circuit (700) that may be included within a PLL or DLL device, such as those described above and shown in FIGS. 5 and 6. As shown in FIG. 7, PFD circuit 700 may include a first flip-flop circuit (710) for receiving a reference clock signal (ref_clk) and a second flip-flop circuit (720) for receiving a feedback clock signal (fb_clk). When incorporated into a PFD, the data inputs of flip-flop circuits 710 and 720 may be coupled for receiving data signals, such as those originating from an upstream charge (or voltage) pump. In this manner, flip-flop circuit 710 may be configured for generating a corrective "pump up" signal (PFD_pu) when the feedback signal lags the reference signal, whereas flip-flop circuit 720 may be configured for generating a corrective "pump down" signal (PFD_pd) when the feedback signal leads the reference signal.

The "pump up" and "pump down" signals generated by flip-flop circuits 710 and 720 are compared by logic circuit 730. In the embodiment of FIG. 7, logic circuit 730 includes a pair of inverting buffers 740, 750 coupled to the inputs of a NOR logic gate 760; however, alternative logic combinations may be used in other embodiments of the invention (e.g., logic circuit 730 may be replaced by an AND logic gate). Referring to FIG. 7, the state of the "pump up" and "pump down" signals are inverted by buffers 730 and 740 before the signals are input to NOR gate 760. If the "pump up" or "pump down" signals are both logic high, NOR gate 760 will generate a RESET signal for resetting flip-flop circuits 710 and 720. Otherwise, flip-flop circuits 710 and 720 may operate in a normal manner by periodically changing state on transitions of the clocking signals.

Figure 8:
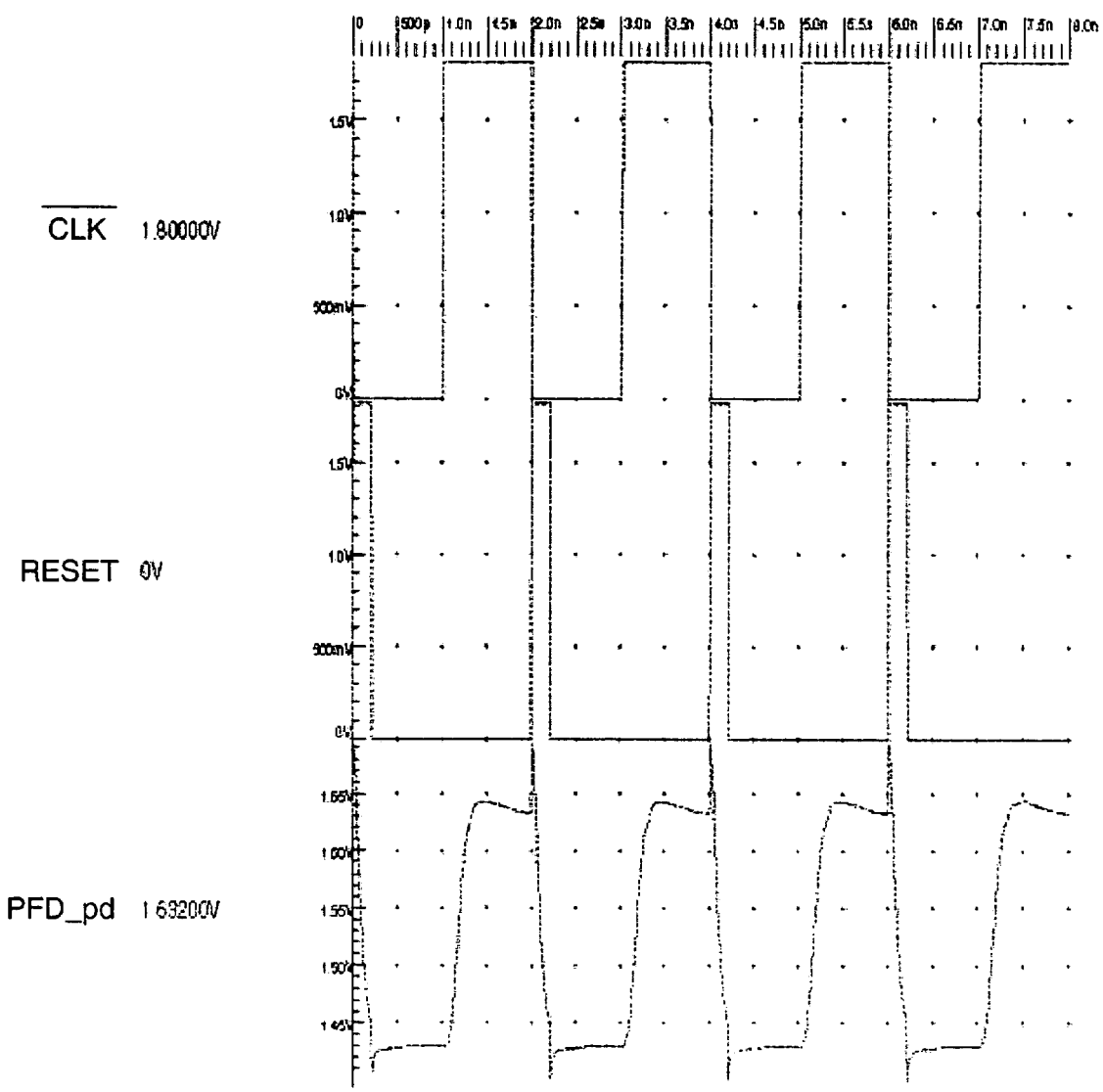
FIG. 8 is a simulation output waveform from a PFD circuit when input signals with CMOS voltage swings are supplied to the low voltage flip-flop circuit of FIG. 4.
Figure 9:
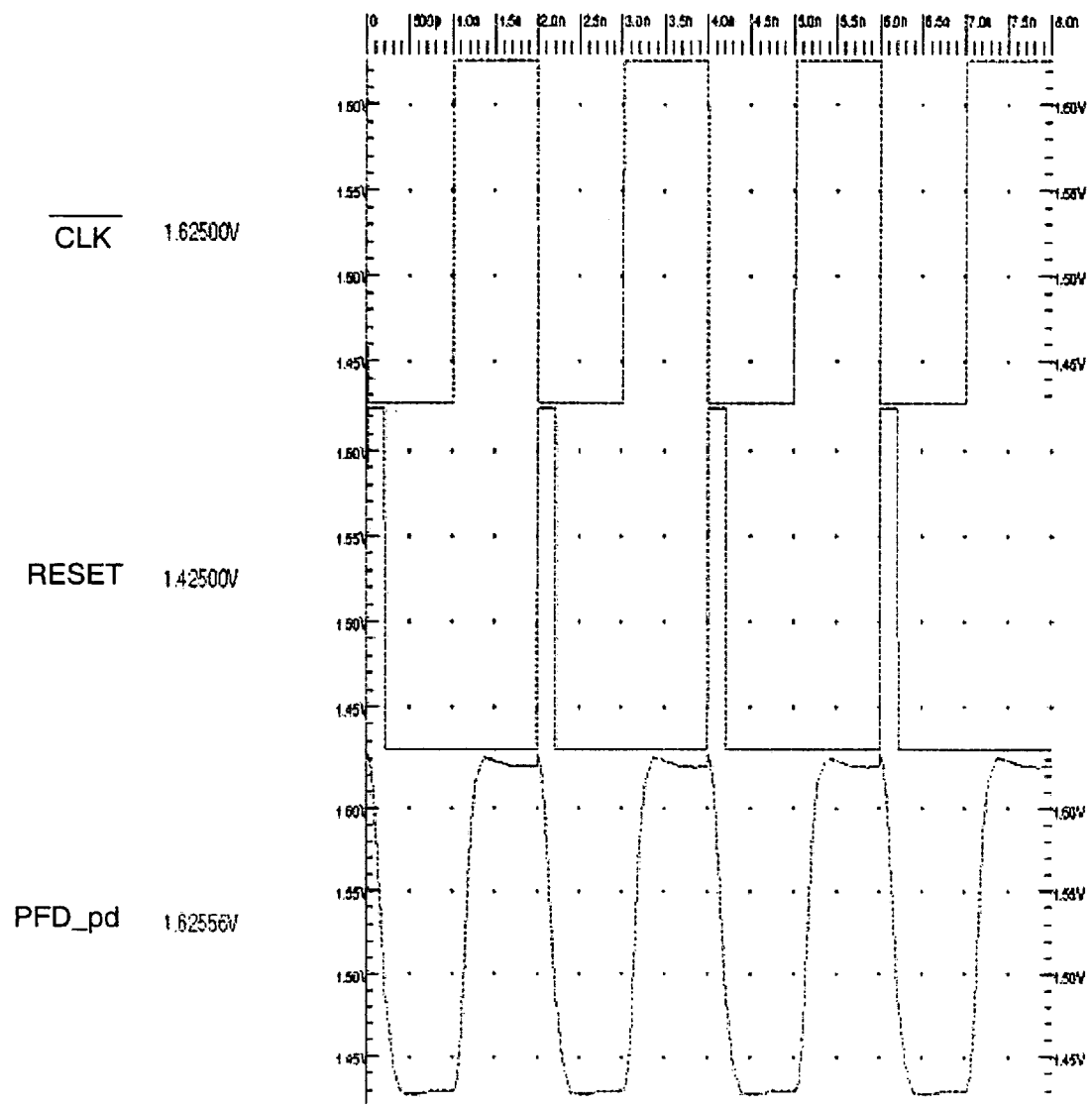
FIG. 9 is a simulation output waveform from a PFD circuit when input signals with CML voltage swings are supplied to the low voltage flip-flop circuit of FIG. 4.

Because of it's low voltage design and SET/RESET capability, the improved flip-flop circuit described herein may be incorporated into PFD circuit 700 as flip-flop circuits 710 and 720. If one or more level shift circuits are included within the flip-flops, PFD circuit 700 may be configured for receiving signals with different voltage swings (e.g., ECL/CML, TTL or CMOS voltage swings, among others) without the need for additional translator circuitry. However, PFD circuit 700 may be alternatively configured for receiving signals with substantially identical voltage swings (e.g., ECL/CML voltage swings). FIGS. 8 and 9 show exemplary output waveforms that may be obtained from PFD circuit 700 when clock and RESET signals with CMOS and CML voltage swings are supplied to the improved flip-flop circuit of FIG. 4.

In the embodiment of FIG. 8, the voltage swings of the differential clock and RESET signals range from about 0V to about 1.8V (CMOS swings). On the other hand, the clock and RESET signals are driven with CML voltage swings ranging between about 1.425V and 1.625V, in the embodiment of FIG. 9. The flip-flop circuit described herein is extremely useful in high speed data path design (e.g., CML implementations) when the control (i.e., SET and RESET) function is slow and driven by CMOS logic gates (as in the case of FIG. 8). As noted above, for example, the internal level shifting capability of the presently described flip-flop circuit eliminates the need for off-chip CMOS to CML translators.

FIG. 10 illustrates another embodiment of the invention, in which more than one level shift circuit is included for shifting the voltage swing of at least two pairs of differential signals supplied to the flip-flop circuit. Similar to the embodiment shown in FIG. 4, flip-flop circuit 1000 includes a master latch (1010), a slave latch (1020) and a level shift circuit (1050) for shifting a voltage swing of the differential clocking signals (CLK and CLKbar) supplied thereto. However, flip-flop circuit 1000 improves upon flip-flop circuit 400 by including an additional level shift circuit (1060) for shifting a voltage swing of the differential RESET/RESETbar signals. In doing so, the advantages provided by level shift circuit 450 (e.g., increased operating speed, use of auto-routing devices, ability to receive input signals with similar or dissimilar voltage swings, etc.) may be enhanced by additional level shift circuit 1060.

For example, the localized buffering provided by level shift circuits 1050 and 1060 may improve the performance of flip-flop circuit 1000 by reducing the input capacitance on the clock and the RESET/RESETbar signal lines. By including a pair of level shift circuits, the input levels for the data, clock, and RESET/RESETbar signals may be substantially identical to one another, thereby enabling all inputs to be driven by the same type of logic gate (e.g., CML gates).

Though flip-flop circuit 1000 is similar to the embodiment shown in FIG. 4, the master and slave portions of circuit 1000 may differ slightly from those shown in previous figures. For example, master latch 1010 may include additional transistors (N21, N22, N23) for controlling the differential input, cross-coupled and RESET transistors based on the states of the level shifted RESET/RESETbar signals. Though flip-flop circuit 1000 is described below in the context of a RESET function, the circuit may be modified to provide a SET function by swapping the collector terminal connections of transistors N15 and N16 and those of transistors N17 and N18.

In the embodiment of FIG. 10, additional transistor N21 may be included within master latch 1010 for disabling differential input transistors N1, N2 and clocking transistor N3, during times when the RESET signal is asserted. For example, additional transistor N21 is coupled between VCC and the emitter terminals of transistors N1, N2 and N3, and adapted for receiving a level shifted version of the RESETbar signal at its base. Additional transistor N23 may be similarly coupled for disabling cross-coupled transistors N4, N5 and clocking transistor N6 when the RESETbar signal is asserted. On the other hand, additional transistor N22 may be coupled between VCC and the emitter terminals of transistors N15 and N16, and adapted for receiving a level shifted version of the RESET signal. As such, additional transistor N22 may be generally configured for changing the polarity of the master latch during times when the RESET signal is asserted.

Flip-flop circuit 1000 may generally operate in the following manner. When the RESET signal is asserted (e.g., logic high), the differential and cross-coupled transistors of the master and slave latches are turned off, regardless of the state of the differential clocking signals. Transistors N15 and N17 are also turned off when the RESET signal is asserted, due to their diode connection with the additional current sources (C7 and C8) coupled to the emitter terminals of transistors N16, N22 and transistors N18, N25. The additional current sources (C7 and C8) included within the master and slave portions of flip-flop circuit 1000 decouple the normal flip-flop function from the RESET function.

Because the differential latch (Z and Zbar) and output (Q and Qbar) signals are driven by transistors N16 and N18, the Z and Q nodes are forced to logic low values when the RESET signal is asserted. In other words, assertion of the RESET signal forces the flip-flop circuit into a RESET state. This occurs because the voltage swings of the clock and data signals are shifted away from VCC due, e.g., to the addition of common mode resistors R1 and R3 in the master stage and the addition of R9 in level shift circuit 1050. These common mode resistors ensure that the high side of the RESET signal swing will be greater than that of the clock and data signal swings.

For example, no common mode resistors may be included within level shift circuit 1060, so that the high side of the RESET signal voltage swing will be directly connected to VCC, and therefore, will be greater than that of the clock and data signals. In some cases, however, a substantially smaller common mode resistor (i.e., having a smaller resistance than R1, R3 and R9) may be included within level shift circuit 1060 without decreasing the RESET signal turn-on potential below that of the clock and data signals. The resistance of R10 should also be larger than the combined resistance of R9 and R7, and larger than the combined resistance of R1 and R3, so that the low side of the RESET signal voltage swing will be lower than that of the clock and data signals. To ensure proper synchronization with the clocking signals, the combined resistance of R9 and R7 in level shift circuit 1050 must be greater than the combined resistance of R1 and R3, so that the low side of the clock signal swings will be lower than that of the data signals.

Figure 11:
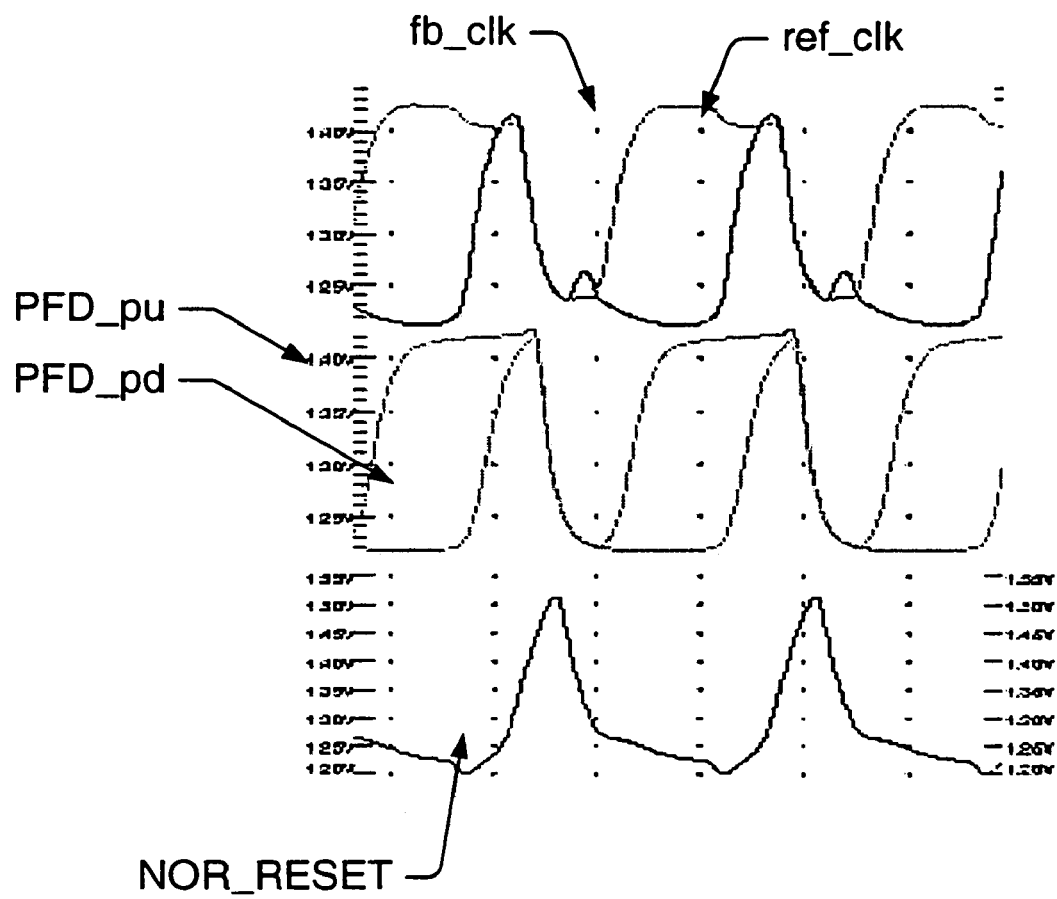
FIG. 11 is a simulation output waveform from a PFD circuit that utilizes the low voltage flip-flop circuit of FIG. 10.

FIG. 11 shows exemplary waveforms that may be obtained from PFD circuit 700 when signals with CML voltage swings are input to flip-flop circuit 1000 of FIG. 10. In the topmost graph, the waveforms labeled "ref_clk" and "fb_clk" correspond to the reference and feedback clocks supplied to the flip-flop circuits 710 and 720 of PFD circuit 700. The waveforms in the middle graph, labeled "PFD_pu" and "PFD_pd," correspond to the corrective "pump up" and "pump down" pulses output from PFD circuit 700. In the lowermost graph, the waveform labeled "NOR_RESET" corresponds to the RESET signal output from NOR logic gate 760. A primary advantage of flip-flop circuit 1000 is that the desired internal signal levels may be "designed in" using the two level shift circuits shown in FIG. 10. Externally, however, the clock and RESET inputs can be driven by CML, ECL or PECL (pseudo ECL), TTL or CMOS gates, among others. FIG. 11 shows that when implemented with flip-flop circuits, such as those shown in FIG. 10, the PFD circuit of FIG. 7 can be RESET in the appropriate manner.

The improved flip-flop circuits described herein offer advantages over the conventional circuit shown in FIG. 1. For example, due to its single level architecture, the improved flip-flop circuits can operate at significantly lower supply voltages (e.g., about 1.5V compared to 2.4V). The minimum supply voltage needed for operating the improved circuits may be generally described as the sum of the swing voltage (the IR drop across the pull-up resistor), the base-emitter voltage ($V_{BE}$), and the voltage drop across the current source. Using Silicon Germanian technology, the minimum supply voltage could be approximately 1.5V, assuming a $V_{BE}$ of about 0.9V, a swing voltage of about 300 mV, and a 300 mv voltage drop across the current source. However, the minimum supply voltage may be slightly higher or lower than 1.5V, in other embodiments of the invention, depending on the particular process technology used.

The improved flip-flop circuits described herein also offer advantages over the conventional circuit shown in FIG. 2. For example, the improved flip-flop circuits advantageously combine SET and/or RESET functions with low voltage operation. The SET and/or RESET functions may be generally provided by including one or more additional transistors within the flip-flop circuit. If one or more level shift circuits are appended to the front end, the improved flip-flop circuits may be configured for receiving input signals with substantially any voltage swing (including, e.g., CML, TTL or CMOS). The addition of the one or more level shift circuits may increase the operating speed of the flip-flop circuit, while eliminating the need for off-chip translators and allowing the use of auto-routing devices. The improved flip-flop circuit may also include one or more common mode resistors for shifting the common mode voltage of one or more signals away from VCC. The common mode voltages of the signals may be shifted to ensure that the voltage swing of the SET/RESET signals will be larger than those of the clocking and data signals.

As noted above, the improved flip-flop circuits may be used within a phase frequency detector of a PLL or DLL device. However, the improved flip-flop circuits should not be limited to PFDs, and may be used with other PLL or DLL components (such as, e.g., programmable counters and frequency dividers) or any other circuit, logic or device requiring low voltage operation with asynchronous SET and/or RESET functions. Though described above as being formed with BJTs, the improved flip-flop circuits may be fabricated with other process technologies, especially if operational speed is not of major concern.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment," "one embodiment," or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A logic circuit coupled between a power supply node and a ground node and comprising a plurality of bipolar junction transistors, wherein each current path extending between the power supply and ground nodes includes no more than one base-emitter junction, and wherein the plurality of bipolar junction transistors comprises:
   a first pair of transistors controlled by a clock signal supplied to the logic circuit and coupled for receiving a pair of differential input signals;
   a second pair of transistors controlled by a complementary clock signal supplied to the logic circuit and coupled for receiving a pair of differential latch signals generated by the first pair of transistors;
   a third pair of transistors controlled by at least one of a SET signal and a RESET signal, wherein at least one of the third pair of transistors is coupled to the first and second pairs of transistors for changing a polarity of at least one of the pair of differential latch signals when the SET or RESET signal is asserted; and
   a first, a second and a third additional transistor, each coupled in a common-emitter configuration with a different one of the first, second and third pairs of transistors.

2. The logic circuit as recited in claim 1, wherein the logic circuit comprises a latch, and wherein the second pair of transistors form a latch pair, such that a base terminal of one of the second pair of transistors is coupled to a collector terminal of another one of the second pair of transistors.

3. The logic circuit as recited in claim 1, wherein the third pair of transistors are coupled together in a common-emitter configuration and comprise collector terminals, which are coupled for receiving a different one of the differential latch signals.

4. The logic circuit as recited in claim 3, wherein a base terminal of one transistor within the third pair of transistors is coupled to its emitter terminal, and wherein a base terminal of another transistor within the third pair of transistors is coupled to the power supply node.

5. The logic circuit as recited in claim 1, further comprising:
   a level shift circuit coupled for reducing a voltage swing of the SET or RESET signal;
   wherein the first and second additional transistors are coupled in a common-emitter configuration with the first and second pairs of transistors, respectively, and configured for receiving a level shifted version of the SET or RESET signal at a base terminal thereof; and
   wherein the third additional transistor is coupled in a common-emitter configuration with the third pair of transistors and configured for receiving a level shifted version of a complementary version of the SET or RESET signal at a base terminal thereof.

6. The logic circuit as recited in claim 1, wherein the first and second additional transistors are coupled to the first and second pairs of transistors and configured for receiving the same signal, either the SET signal or the RESET signal, at a base terminal thereof.

7. The logic circuit as recited in claim 6, wherein the third additional transistor is coupled to the third pair of transistors and configured for receiving either the SET signal or the RESET signal at a base terminal thereof, whichever is opposite to that received by the first and second additional transistors.

8. The logic circuit as recited in claim 1, further comprising:
   a level shift circuit coupled for reducing a voltage swing of the clock and complementary clock signals;
   a fourth additional transistor coupled in a common-emitter configuration with the first pair of transistors and configured for receiving a level shifted version of the clock signal at a base terminal thereof; and
   a fifth additional transistor coupled in a common-emitter configuration with the second pair of transistors and configured for receiving a level shifted version of the complementary clock signal at a base terminal thereof.

9. A flip-flop circuit coupled between a power supply node and a ground node, wherein each current path extending between the power supply and ground nodes includes no stacked transistors, and wherein the flip-flop comprises:
   (i) a master latch comprising:
      (a) a first pair of differential input transistors coupled for receiving a pair of differential input signals supplied to the flip-flop circuit;
      (b) a first pair of cross-coupled transistors coupled for receiving a pair of differential latch signals generated by the first pair of differential input transistors;
      (c) at least one transistor coupled between the first pair of differential input transistors and the first pair of cross-coupled transistors, wherein the at least one transistor is controlled by at least one of a SET signal and a RESET signal;
      (d) a first additional transistor coupled to the first pair of differential input transistors and configured for receiving a level shifted version of a clock signal; and
      (e) a second additional transistor coupled to the first pair of cross-coupled transistors and configured for receiving a level shifted version of a complementary clock signal; and
   (ii) a first level shift circuit coupled for producing the level shifted versions of the clock and complementary clock signals by reducing a voltage swing of clock and complementary clock signals supplied to the level shift circuit.

10. The flip-flop circuit as recited in claim 9, wherein the at least one transistor is coupled for changing a polarity of one of the differential latch signals, depending on a state of the SET signal and a state of another one of the differential latch signals.

11. The flip-flop circuit as recited in claim 9, wherein the at least one transistor is coupled for changing a polarity of one of the differential latch signals, depending on a state of the RESET signal and a state of another one of the differential latch signals.

12. The flip-flop circuit as recited in claim 9, further comprising a slave latch coupled in series with the master latch, wherein the slave latch comprises:
   a second pair of differential input transistors coupled for receiving the pair of differential latch signals;

a second pair of cross-coupled transistors coupled for receiving a pair of differential output signals generated by the second pair of differential input transistors; and at least one transistor coupled between the second pair of differential input transistors and the second pair of cross-coupled transistors, wherein the at least one transistor is controlled by at least one of the SET and the RESET signals.

13. The flip-flop circuit as recited in claim 9, further comprising:

third and fourth additional transistors coupled to the first pair of differential input transistors and the first pair of cross-coupled transistors, respectively, and configured for receiving a level shifted version of the SET or the RESET signal;

a fifth additional transistor coupled to the at least one transistor and configured for receiving a level shifted version of a complementary SET or RESET signal; and a second level shift circuit coupled for producing the level shifted versions of the differential SET or RESET signals by reducing a voltage swing of the differential SET or RESET signals supplied to the second level shift circuit.

14. The flip-flop circuit as recited in claim 13, wherein the at least one transistor comprises a pair of SET or RESET transistors, each coupled for changing a polarity of a different one of the differential latch signals based on the level shifted version of the complementary SET or RESET signal supplied to the fifth additional transistor.

15. The flip-flop circuit as recited in claim 9, wherein the at least one transistor comprises a pair of SET or RESET transistors, which are coupled for receiving the SET signal or the RESET signal, at base terminals thereof.

16. The flip-flop circuit as recited in claim 15, wherein when the SET signal is received, a transistor of the pair of SET or RESET transistors is coupled for changing a polarity of a first one of the differential latch signals, depending on a state of the SET signal and a state of a second one of the differential latch signals.

17. The flip-flop circuit as recited in claim 15, wherein when the RESET signal is received, a transistor of the pair of SET or RESET transistors is coupled for changing a polarity of a second one of the differential latch signals, depending on a state of the RESET signal and a state of a first one of the differential latch signals.

* * * * *